(12) United States Patent
Jung et al.

(10) Patent No.: US 6,634,368 B1
(45) Date of Patent: Oct. 21, 2003

(54) APPLICATION OF OZONATED DI WATER TO SCRUBBERS FOR RESIST STRIP AND PARTICLE REMOVAL PROCESSES

(75) Inventors: Claire Ching-Shan Jung, Plano, TX (US); Neal T. Murphy, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/666,974

(22) Filed: Sep. 21, 2000

Related U.S. Application Data

(60) Provisional application No. 60/165,148, filed on Nov. 12, 1999.

(51) Int. Cl.7 .............................. B08B 3/02; B08B 3/12
(52) U.S. Cl. .............................. 134/1.3; 134/2; 134/18; 134/19; 134/25.4; 134/902
(58) Field of Search ............................. 134/1–3, 2, 18, 134/19, 25.4, 902

(56) References Cited

U.S. PATENT DOCUMENTS

| | | | |
|---|---|---|---|
| 5,464,480 A | * 11/1995 | Matthews | 134/1.3 |
| 6,273,108 B1 | * 8/2001 | Bergman et al. | 134/102.1 |
| 6,345,630 B2 | * 2/2002 | Fishkin et al. | 134/1.3 |

FOREIGN PATENT DOCUMENTS

EP          0548 596 A2 *  6/1993

* cited by examiner

*Primary Examiner*—Zeinab El-Arini
(74) *Attorney, Agent, or Firm*—Jacqueline J. Garner; W. James Brady, III; Frederick J. Telecky, Jr.

(57) ABSTRACT

A method for resist strip and particle removal. Wafers (108) with a patterned resist formed thereon are placed on a wafer chuck (104) in a scrubber tool (100,200). Ozonated deionized water (112) is applied to the surface of wafer (108). The ozonated deionized water (112) strips the resist and removes the resist residue without the use of hazardous chemicals. Particle removal is accomplished in the same tool (100,200). The ozonated deionized water (112) is formed in a closed canister (114). Deionized water is circulated through the canister (114) and ozone is added to the deionized water at a premixer (118).

10 Claims, 2 Drawing Sheets

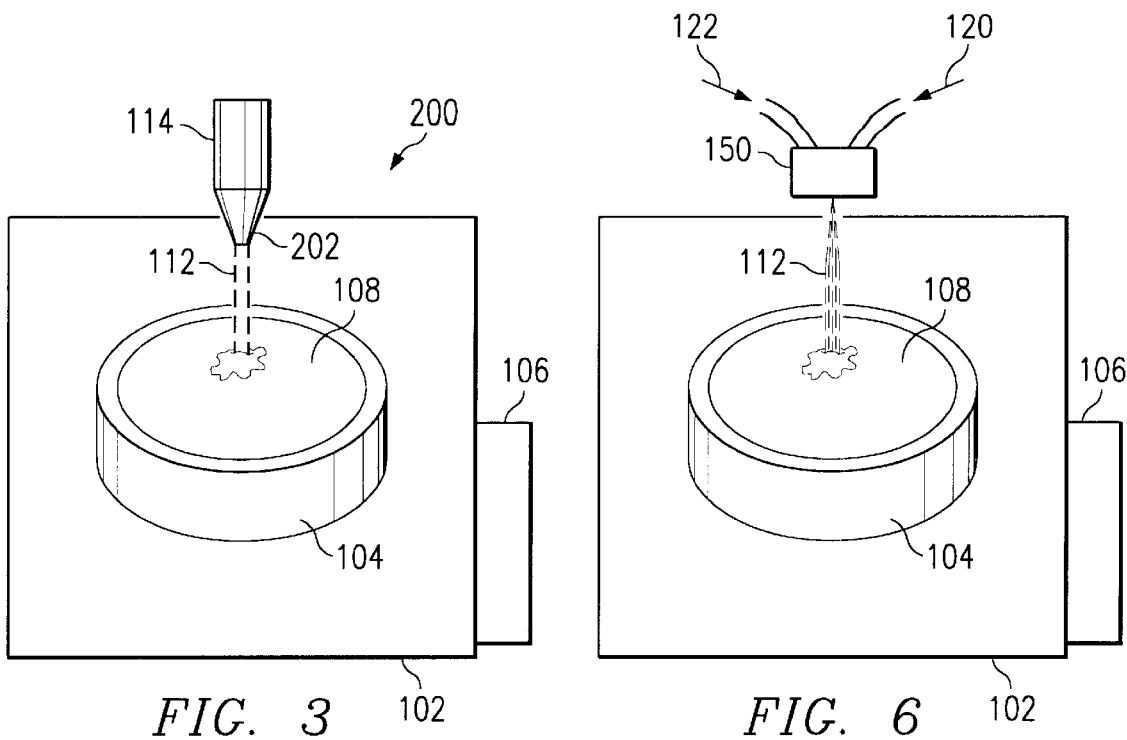
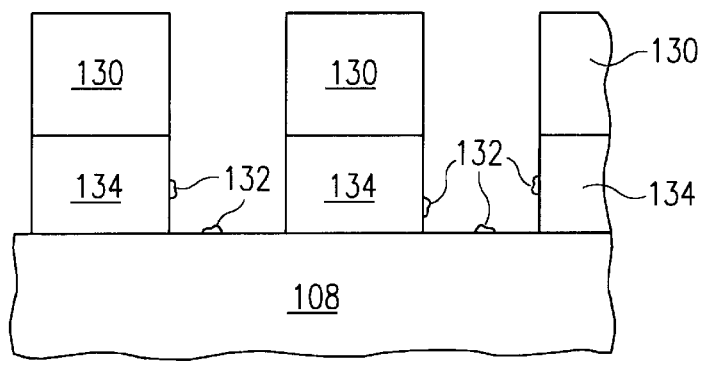
FIG. 4
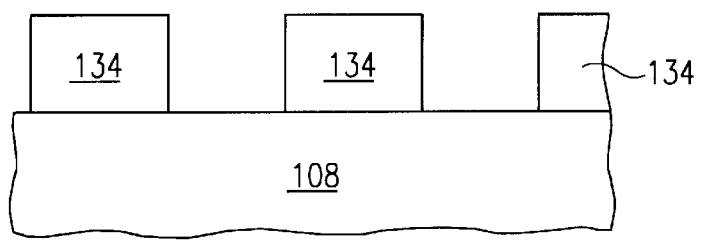
FIG. 5

APPLICATION OF OZONATED DI WATER TO SCRUBBERS FOR RESIST STRIP AND PARTICLE REMOVAL PROCESSES

This application claims priority under 35 USC §119(e)(1) of provisional application No. 60/165,148 filed Nov. 12, 1999.

CROSS-REFERENCE TO RELATED APPLICATIONS

The following co-pending applications are related and are hereby incorporated by reference:

| Serial No. | Filing date | Inventors |
|---|---|---|
| 09/667,154 | Sep. 21, 2000 | Jung et al. |
| 09/666,578 | Sep. 21, 2000 | Murphy et al. |
| 09/666,988 | Sep. 21, 2000 | Murphy et al. |

FIELD OF THE INVENTION

The invention is generally related to the field of resist patterning of semiconductor devices and more specifically to resist strip and resist residue removal processes.

BACKGROUND OF THE INVENTION

In the fabrication of semiconductor devices, photoresist patterns are routinely used for delineating certain areas of the semiconductor device, for example, for patterned etching and ion implantation. After the etch or implantation sequence, the resist pattern must be removed. This is referred to as a resist strip. Additionally, any resist residue must also be removed. Currently, an ozonated $H_2SO_4$ operated at 130° C. or a combined solution of $H_2SO_4$ and $H_2O_2$ are widely used for resist strip. To reduce particles, the above resist strip process is followed by a SC1 ($H_2O:NH_4OH:H_2O_2$) megasonic cleanup. Alternatively, a deionized water (DIW) scrub may be used for particle removal.

Unfortunately, the chemicals described above for resist strip are not environmentally safe and require special precautions for handling and disposal. Furthermore, sulfur compounds have been found to be left on wafer surfaces after the $H_2SO_4$ cleanups, which may cause corrosions or work function shifts on devices. The SC1 clean-up may result in $NH_3$ abatement. If the alternative DIW scrub is used, two process tools are required. Accordingly, a resist strip and particle removal process is desired that is environmentally safe and overcomes the above mentioned particle removal problems.

U.S. Pat. No. 5,464,480 describes a process for removing organic materials such as photoresist without the use of $H_2SO_4$ and $H_2O_2$. Wafers are placed in a tank containing chilled deionized water. Ozone is diffused into the chilled deionized water to oxidize the organic material from the wafer surface. This process requires the addition of a chiller to current process equipment.

SUMMARY OF THE INVENTION

One aspect of the invention is a combined resist strip and particle removal process that uses ozonated deionized water at elevated temperatures in a scrubber. Both resist strip and particle removal are accomplished using a single scrubber step instead of two steps (a bench resist strip and a megasonic cleanup for particle removal).

Another aspect of the invention is a canister for use in forming the ozonated deionized water. The canister is filled with deionized water. The deionized water is circulated through the canister and ozone is added at a premixer stage. A dissolved ozone monitor may be used to monitor the ozone level and shut off the ozone when the ozone concentration reaches a set point.

An advantage of the invention is providing a single step resist strip and particle removal process that is environmentally safe.

This and other advantages will be apparent to those of ordinary skill in the art having reference to the specification in conjunction with the drawings.

BRIEF DESCRIPTION OF THE DRAWINGS

In the drawings:

FIG. 3 is a diagram of a second scrubber system for removing a resist pattern and particles according to the invention;

FIG. 4 is a cross-sectional diagram of a semiconductor wafer having a resist pattern formed thereon;

FIG. 5 is a cross-section diagram of the semiconductor wafer of FIG. 4 after resist strip and particle removal according to the invention;

FIG. 6 is a diagram of an alternative embodiment of the invention wherein DIW and zone are mixed at a spray nozzle.

DETAILED DESCRIPTION OF THE EMBODIMENTS

The process of the present invention uses ozonated deionized (DI) water in conjunction with a scrubber for resist strip and particle removal. Elevated temperatures were found to result in an enhanced resist strip rate. Optimum temperatures were found to be in the range of 55–65° C. Residual analysis has showed that ozonated DI water has better removal efficiency on organic compounds. The process of the present invention eliminates the use of hazardous chemicals in positive resist strip and resist residue removal processes.

Figure 1:
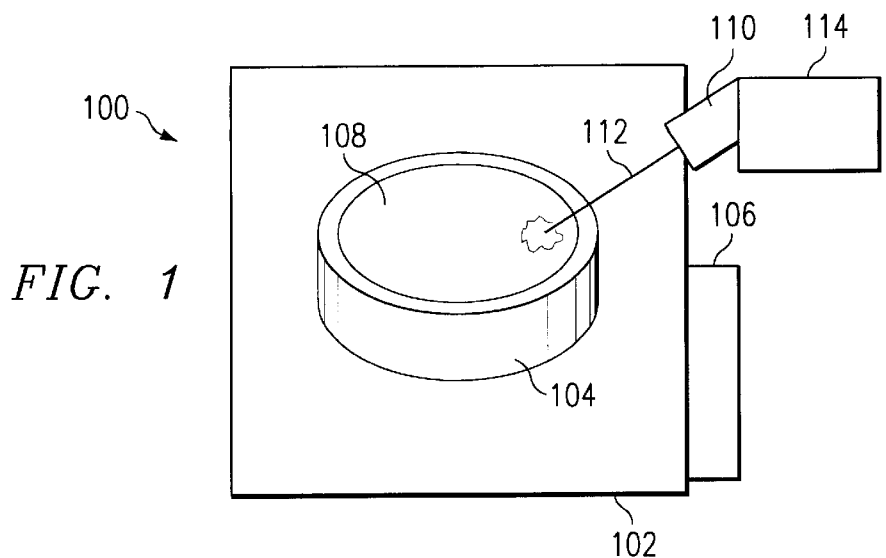
FIG. 1 is a diagram of a first scrubber system for removing a resist pattern and particles according to the invention.

There are two types of scrubbers that may be used in conjunction with the invention. The first type is a pressure-jet scrubber that has $CO_2$ injected to prevent wafer damage due to charging. A pressure-jet scrubber 100 modified according to the invention is shown in FIG. 1. Pressure-jet scrubber 100 includes a chamber 102 with a wafer chuck 104 located therein. Wafer chuck 104 is used to hold a wafer 108 for scrubbing.

Figure 2A:
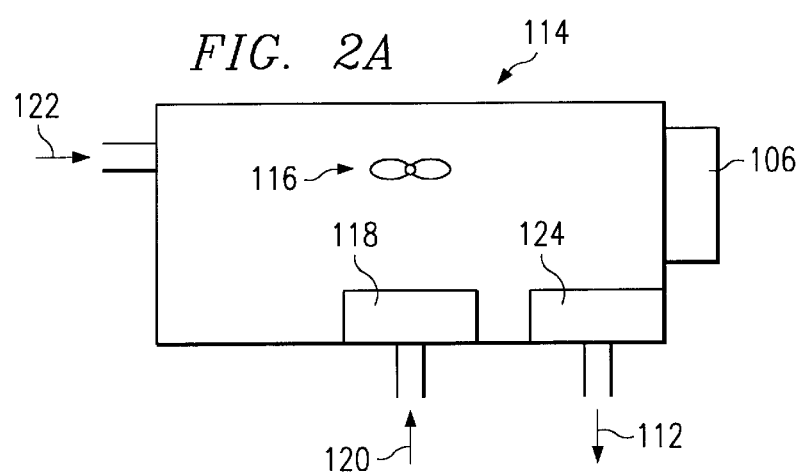
FIGS. 2A and 2B are diagrams of canisters for use with the scrubber system of FIG. 1.
Figure 2B:
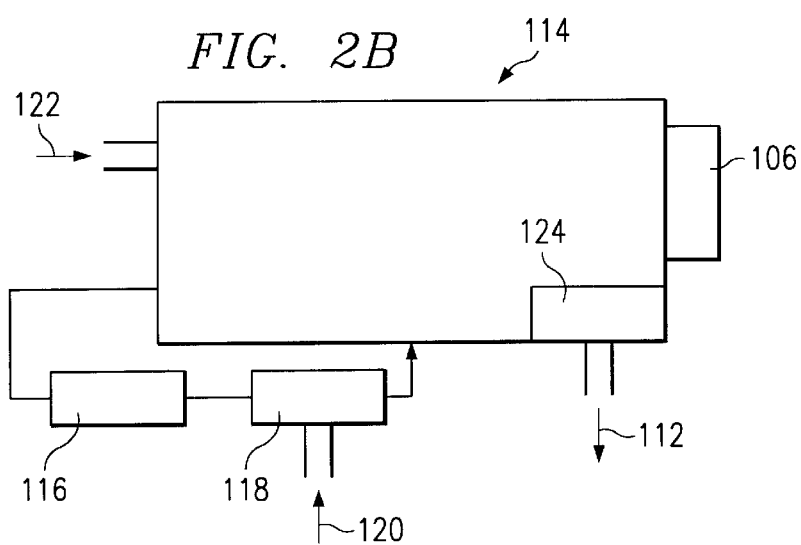

Pressure-jet 110 is used to supply ozonated DIW 112 to wafer 108. Methods for forming ozonated DIW are known in the art. However, in a preferred embodiment of the invention ozonated DIW 112 is formed in a closed canister 114. FIGS. 2A and 2B show exploded views of alternative canisters 114. DIW 122 in canister 114 is recirculated through a pump 116, premixer 118, and preferably heater 106. Ozone 120 is injected to the premixer 118 to enhance the dissolved ozone concentration. Opposite flow of the ozone 120 and DIW 122 further increases concentration. Ozonated DIW 112 is then injected from the canister 114 during processing. The same amount of fresh DIW 122 is added to the canister after each injection.

Heat may be applied to the system in a number of ways. For example, wafer chuck 104 may be heated with or without additional heating to the ozonated DIW water 112. Chamber 102 may be heated in addition to wafer chuck 104 and/or ozonated DIW 112 heating. Ozonated DIW 112 may be heated in canister 114 with or without wafer chuck and chamber heating. Ozonated DIW 112 may alternatively be heated at nozzle 110 in conjunction with wafer chuck 104 heating. Heating mechanism 106 may provide infrared (IR) radiation to heat chamber 102, chuck 104 or nozzle 110. Alternatively, heating mechanism may provide an oven ambient or use microwave heating.

Dissolved ozone monitor 124 may be used to monitor the concentration of ozone in ozonated DIW 112. The supply of ozone 120 is shut off after the set point is reached. In the preferred embodiment, ozone is supplied at a gas phase concentration on the order of 50 g/m$^3$.

After being applied to wafer 108, the ozonated DIW 112 is preferably not recirculated. Thus, no filter is needed in a recirculation loop. The single pass of chemicals on the wafer 108 results in lower incidence of wafer-to-wafer or lot-to-lot cross-contamination. In addition, the above system uses less ozone. Saturation of ozone can be achieved more easily in the closed system of canister 114 than in an open system.

A second type of scrubber is a megasonic scrubber. A scrubber 200 with a megasonic nozzle 202 is shown in FIG. 3. Megasonic type scrubbers have better particle removal efficiency with the use of megasonic nozzles. Like pressure-jet scrubber 100, megasonic scrubber 200 includes a chamber 102 with a wafer chuck 104 located therein. Wafer chuck 104 is used to hold a wafer 108 for scrubbing. The heating mechanisms discussed above for the first type of scrubber may also be used with a megasonic scrubber.

Megasonic nozzle 202 is used to supply ozonated DIW 112 to wafer 108. Ozonated DIW 112 may be formed in canister 114. FIG. 2 described above shows an exploded view of canister 114. DIW in canister 114 is recirculated through a pump 116, premixer 118, and heater 106. Ozone 120 is injected to the premixer 118 to enhance the dissolved ozone concentration. Ozonated DIW 112 is then injected from the canister 114 during processing. The same amount of fresh DIW 122 is added to the canister after each injection.

Dissolved ozone monitor 124 may be used to monitor the concentration of ozone in ozonated DIW 112. The supply of ozone 120 is shut off after the set point is reached. In the preferred embodiment, ozone is supplied at a gas phase concentration on the order of 50 g/m$^3$.

After being applied to wafer 108, the ozonated DIW 112 is preferably not recirculated. Thus, no filter is needed in a recirculation loop. The single pass of chemicals on the wafer 108 results in lower incidence of wafer-to-wafer or lot-to-lot cross-contamination. In addition, the above system uses less ozone. Saturation of ozone can be achieved more easily in the closed system of canister 114 than in an open system.

In application, DIW 122 is added to canister 114 and circulated through pump 116, pre-mixer 118, and heater 106. At pre-mixer 118, ozone is added to create ozonated DIW 112. Fluid is continually recirculated through canister 114.

Wafer 108 is placed on wafer chuck 104 in either of the scrubbers 100 or 200. Wafer chuck 104 may be heated to attain a higher process temperature. In this manner a higher process temperature may be attained without affecting the ozone concentration in ozonated DIW 112. Ozonated water 122 may be applied to wafer 108 at an elevated temperature. In the preferred embodiment, a temperature on the order of 55–65° C. is used. The process of the present invention at elevated temperatures on the order of 60° C. was found to have a higher resist strip rate than chilled ozonated DI water processes. Ozonated water 122 may be applied through a pressure jet 110 as shown in FIG. 1 or a megasonic nozzle 202 as shown in FIG. 3. Other application methods will be apparent to those of ordinary skill in the art. For example, ozonated DIW 122 may be applied through a wash function of a typical scrubber. Applying ozonated DIW 122 at elevated temperatures strips a resist pattern and any resist residue from the surface of wafer 108. FIG. 4 shows wafer 108 prior to application of warm ozonated DIW.

FIG. 4 is a cross-sectional diagram of wafer 108 with resist pattern 130 and resist residue 132 formed thereon. As shown in FIG. 4, resist pattern 130 may be used as a pattern for etching layer 134. Resist patterns, such as pattern 130 are used throughout the semiconductor fabrication process for forming patterned structures, masking implants, etc Resist pattern 130 may optionally include an adhesion promoter, such as HMDS (hexamethyldisilazane). During an etch or implantation process, for example, resist residue 132 may form on the exposed surface of the etched layer or layers 134.

FIG. 5 shows wafer 108 after resist strip and particle removal according to the invention. Both the resist strip and particle removal are performed in a single scrubber tool rather than using two process steps: one for resist strip and one for particle removal. In addition, the process is performed without the use of hazardous chemicals.

In an alternative embodiment of the invention, ozone gas 120 and DIW 122 are mixed at a sprayer 150 instead of in a canister as described above. Ozonated DIW 112 is then sprayed onto the surface of wafer 108 as shown in FIG. 6.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an integrated circuit, comprising the steps of:

providing a semiconductor wafer with a resist pattern formed thereon;

placing said semiconductor wafer on a wafer chuck in a scrubber;

applying an ozonated deionized water to a surface of said wafer to remove said resist pattern, while said wafer is on said wafer chuck in the scrubber.

2. The method of claim 1, wherein said ozonated deionized water is applied at an elevated temperature in a range of 55–65° C.

3. The method of claim 1, wherein said ozonated deionized water is formed by combining deionized water with ozone in a closed canister.

4. The method of claim 3, further comprising the steps of:

adding the deionized water to said closed canister;

circulating said deionized water through a pump and a premixer; and adding the ozone to said deionized water at said premixer to form said ozonated deionized water.

5. The method of claim 1, wherein said wafer chuck is heated.

6. The method of claim 1, wherein said ozonated deionized water is applied using a pressure jet of said scrubber.

7. The method of claim 1, wherein said ozonated deionized water is applied using a megasonic nozzle of said scrubber.

8. The method of claim 1, wherein said ozonated deionized water is formed by mixing an ozone gas and a deionized water at a spray nozzle of a scrubber.

9. The method of claim 1, wherein said ozonated deionized water is applied at an elevated temperature in a range of 55–65° C., said wafer chuck is heated and a process chamber surrounding said wafer chuck is heated.

10. The method of claim 1, wherein said ozonated deionized water is heated at a nozzle of said scrubber to a temperature in a range of 55–65° C. and said wafer chuck is heated.

* * * * *